(12) United States Patent
Tseng

(10) Patent No.: US 6,897,510 B2
(45) Date of Patent: May 24, 2005

(54) MIM CAPACITOR HAVING A HIGH-DIELECTRIC-CONSTANT INTERELECTRODE INSULATOR AND A METHOD OF FABRICATION

(75) Inventor: Horng-Huei Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/647,715

(22) Filed: Aug. 25, 2003

(65) Prior Publication Data

US 2005/0048713 A1 Mar. 3, 2005

(51) Int. Cl.[7] .................... H01L 27/108; H01L 29/76; H01L 29/94; H01L 31/119
(52) U.S. Cl. ................ 257/306; 438/239; 438/396; 438/253; 438/254
(58) Field of Search .............................. 438/239, 244, 438/396, 399, 250, 253–254, 381, 393, 386–387; 257/306

(56) References Cited

U.S. PATENT DOCUMENTS

| | | | |
|---|---|---|---|
| 5,335,138 A | * 8/1994 | Sandhu et al. ............ 361/303 |
| 5,877,062 A | 3/1999 | Horii ........................... 438/396 |
| 5,930,639 A | * 7/1999 | Schuele et al. ............. 438/396 |
| 5,994,197 A | 11/1999 | Liao ............................ 438/396 |
| 6,084,765 A | 7/2000 | Lee ............................. 361/311 |
| 6,090,658 A | * 7/2000 | Joo ............................. 438/240 |
| 6,232,133 B1 | 5/2001 | Kim et al. ..................... 438/3 |
| 6,277,702 B1 | 8/2001 | Chun et al. ................. 438/396 |
| 6,559,003 B2 | * 5/2003 | Hartner et al. ............. 438/253 |
| 6,677,251 B1 | * 1/2004 | Lu et al. ..................... 438/778 |

* cited by examiner

*Primary Examiner*—Amir Zarabian
*Assistant Examiner*—Thanh Y. Tran
(74) *Attorney, Agent, or Firm*—Haynes and Boone, LLP

(57) ABSTRACT

A metal-insulator-metal (MIM) capacitor using a high-k dielectric and method of fabrication are described. After forming node contacts to the substrate a patterned stacked layer comprised of a first metal layer, an insulating dummy layer, and a second metal layer is formed over the node contacts. Sidewall spacers are formed form a third metal layer to complete the lower electrode. A thin dielectric film is deposited. A patterned fourth metal layer is used as the upper electrode to complete the MIM capacitor. The patterned insulating dummy layer acts as a template for making the capacitor without partaking in the electrical properties of the capacitor. The height of the dummy layer is used to fine-tune the capacitance for the circuit requirements. The dummy layer is not an active part of the circuit. The dummy layer does not react with the metals, barrier layers are not required, reducing process complexity.

31 Claims, 2 Drawing Sheets

MIM CAPACITOR HAVING A HIGH-DIELECTRIC-CONSTANT INTERELECTRODE INSULATOR AND A METHOD OF FABRICATION

BACKGROUND OF THE INVENTION (1) Field of the Invention

The present invention relates to a capacitor structure and fabrication for high-density integrated circuits, and more particularly relates to a method for making a metal insulator-metal (MIM) capacitor having a high-dielectric-constant k. The capacitor structure uses a novel patterned dummy layer formed from an insulating material. The height of a patterned dummy layer is used to fine-tune the capacitance for the electrical circuit requirements. The patterned dummy layer acts as a template for making the capacitor without partaking in the electrical properties of the capacitor.

(2) Description of the Prior Art

Capacitors on semiconductor chips are used for various integrated circuit applications. One application is for providing storage capacitors on dynamic random access memory (DRAM) circuits. As the minimum feature size of devices decreases to dimensions less than 0.25 micrometer (mm) and the storage capacitors decrease in size (area), it is necessary to increase the capacitance. One method is to make a stacked capacitor having a third dimension (height) Which increases the capacitor area without increasing the area occupied by the capacitor on the chip. However, as the height of the stacked capacitors increases and the topography gets rougher, it becomes increasingly difficult to form high-resolution patterns over the rough topography during subsequent processing. One approach to circumvent this problem is to use planarizing techniques to form a planar insulating layer over the capacitor. However, this approach requires additional processing complexity as well as increased manufacturing cost.

Another method for increasing the capacitance without increasing the capacitor height is to use a high-dielectric-constant material, such as tantalum pentoxide ($Ta_2O_5$), as the interelectrode dielectric film between the capacitor electrodes. Typically these two approaches are used in combination to satisfy the high-capacitance requirements while maintaining an acceptable topography.

Numerous methods have been reported in the literature for making high-dielectric MIM stacked capacitors. In U.S. Pat. No. 6,277,702 B1 to Chun et al., a method is described for forming a reliable MIM capacitor having a polysilicon capacitor storage node and using an interelectrode high-k dielectric film. To avoid interface problems that can cause leakage problems between the polysilicon and the high-k film, a transition metal such as platinum (Pt) is used. Then to prevent the Pt from reacting with the polysilicon capacitor storage nods, a barrier layer is required. In U.S. Pat. No. 6,084,765 to Lee, the capacitor storage node is formed from a transition metal. In this approach a diffusion barrier layer is formed over the node contact and a thick transition metal capacitor storage nods is formed on the barrier layer over the node contact. However, to electrically isolate the barrier layer from the high-k film at the edge, the transition metal layer is recessed, and an insulating layer such as $Al_2O_3$ or $Ta_2O_5$ is formed in the recess at the edge. To achieve higher capacitance it is also necessary to increase the height of the capacitor storage node, which requires etching a thick, more exotic material transition metal, such as Pt, ruthenium (Ru) or iridium (Ir), which is difficult to do. In U.S. Pat. No. 5,994,197 to Liao, a method is described for making DRAM capacitors with increased capacitance. A node contact is formed in a thick insulating layer and a trench is etched in the insulator around the node contact to increase the area of the capacitor made thereon. U.S. Pat. No. 5,877,062 to Horli describes a method for making a stacked MIM capacitor similar to U.S. Pat. No. 6,084,765 to Lee, and has similar shortcomings. Kim et al., U.S. Pat. No. 6,232,133 B1, describes a method for making a ferroelectric capacitor that does not use the sidewalls of a capacitor storage node to increase and control the capacitance.

There is still a need in the semiconductor industry to form stacked metal-insulator-metal (MIM) capacitor structures with high capacitance while reducing process complexity and improving product yield.

SUMMARY OF THE INVENTION

A principal object of the present invention is to fabricate a stacked Metal-Insulator-Metal (MIM) capacitor structure having a high-dielectric-constant interelectrode film between the capacitor electrodes.

A second object of this invention is to use a patterned dummy layer, that is not part of the active capacitor, as a template on which the MIM capacitor is formed. The dummy layer is formed from an insulating material that is easy to etch and does not require multiple barrier layers, as in the prior art, thereby reducing manufacturing costs.

A third object of this invention is to use the patterned dummy layer to control the height of the capacitor in order to fine-tune the value of the capacitance required for the circuit design.

In accordance with the objects of the present invention, a method is described for making MIM capacitors using a patterned dummy layer to increase and accurately control the capacitance value. Since the dummy layer is an insulating material, it eliminates the need to include a barrier layer, which simplifies the process. The method of making this novel structure consists of providing a semiconductor substrate having partially completed circuits, such as FETs and the like. An insulating layer is deposited to electrically isolate and protect the underlying devices. Openings for node contacts are formed in the insulating layer. A conducting layer, such as doped polysilicon, is deposited to fill the openings and is polished back to the insulating layer to form node contacts in the openings. A first metal layer, a dummy layer, and a second metal layer are deposited sequentially on the insulating layer and over the node contacts to form a stacked layer. The second metal layer, the dummy layer, and the first metal layer are patterned, to leave portions of the stacked layer over the node contacts. The thickness (height) of the dummy layer is used to control the value and accuracy of the capacitance, while the first and second metal layers serve as part of the capacitor lower electrodes. The dummy layer is an insulating material, such as a chemical-vapor-deposited (CVD) silicon oxide or a spin-on glass (SOG). The material for the dummy layer is selected so that a barrier layer is not required, as is commonly practiced when a polysilicon is used to make stacked storage nodes for capacitors. Next, a blanket conformal third metal layer is deposited on the substrate and over the portions of the stacked layer. The third metal layer is anisotropically etched back to form sidewall spacers on the portions of the stacked layer to complete the loner electrodes for the capacitors. A blanket conformal interelectrode dielectric layer (IDL) is deposited on the substrate and over the lower electrodes. A blanket fourth metal layer is conformally deposited on the IDL. The fourth metal layer and the IDL are patterned to form the upper electrodes and to complete the MIM capacitors.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

The present invention relates to a method for making metal-insulator-metal (MM) stacked capacitors with increased capacitance. The method utilizes a patterned dummy layer while eliminating the need for metal barrier layers, thereby improving product yields and reducing manufacturing costs.

Figure 1:
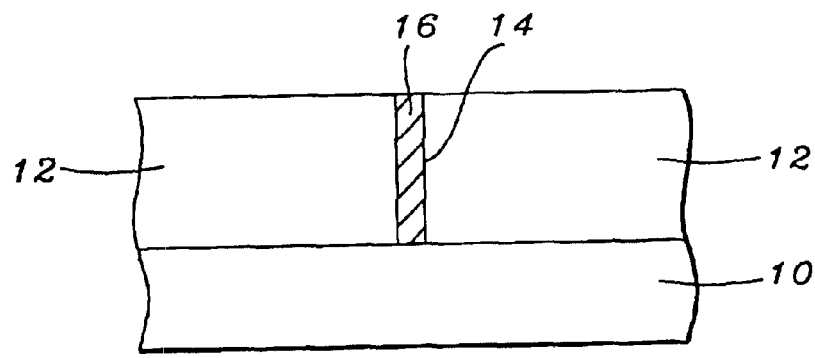
FIGS. 1 through 6 are schematic cross-sectional views for the sequence of process steps of this invention for making a MIM capacitor that uses a novel patterned dummy layer to increase the capacitance and to control the capacitance value.

Referring to FIG. 1, a semiconductor substrate 10 having partially completed circuits, such as FETs and the like, is provided. Typically the substrate 10 includes field oxide (FOX) isolation regions surrounding active device areas in which the semiconductor devices are formed. The FOX regions and the semiconductor devices are not depicted to simplify the drawings. A substrate commonly used in the industry is composed of a single-crystal silicon having a <100> crystallographic orientation. An insulating layer 12 is deposited to electrically isolate and protect the underlying devices in and on the substrate. The insulating layer 12 is preferably silicon oxide, deposited, for example, by CVD using tetraethosiloxane (TEOS) as the reactant gas. The insulating layer 12 is deposited to a preferred thickness of between about 3000 and 12000 Angstroms. Photolithographic techniques and anisotropic plasma etching are used to etch node contact openings 14 in the insulating layer 12 to the active device areas in the substrate 10. A conducting layer 16 is deposited sufficiently thick to fill the contact openings 14. Preferably layer 16 is a conductively doped polysilicon. However, other conducting materials, such as tungsten and the like, can also be used. The conducting layer 16 is planarized, for example by chemically-mechanically polishing back and/or by plasma etching back to the insulating layer 12 to form node contacts 16 in the openings 14, as shown in FIG. 1.

Figure 2:
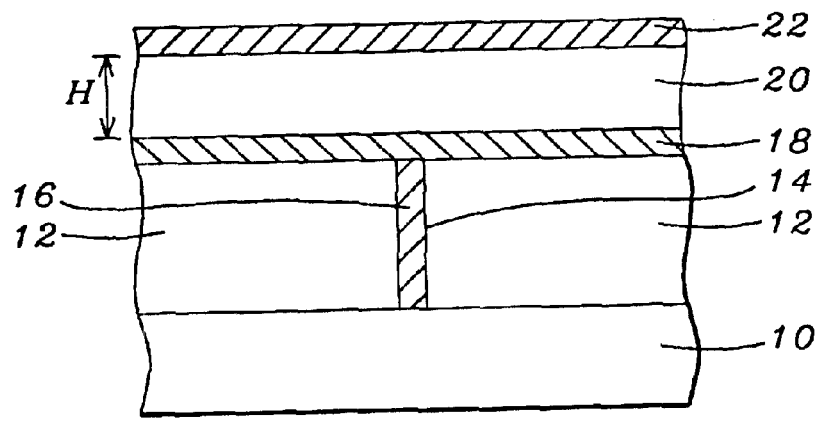

Referring to FIG. 2, a stacked layer is formed by depositing sequentially a first metal layer 18, a dummy layer 20, and a second metal layer 22 on the insulating layer 12 and over the node contacts 16. The first metal layer 18 is preferably a conducting nitride, such as TiN, WN, or TaN. The first metal layer 18 can also be a refractory metal, such as Ti or W. Layer 18 is deposited preferably by sputter deposition or by a CVD method. The first metal layer 18 is deposited to a preferred thickness of between about 100 and 1000 Angstroms. The first metal layer 18 can be any kind of conducting layer including a conducting barrier layer, thereby simplifying the process steps. A key feature of this invention is to use a dummy layer that does not react with the first metal layer 18 or with the second metal layer 22, and is of the height required for the lower electrode. The material for the dummy layer 20 is selected so that a barrier layer is not required. The second metal layer 22 is a transition metal layer, such as platinum (Pt), ruthenium (Ru), or iridium (Ir), deposited to a thickness of between about 100 and 600 Angstroms, and also does not require an additional barrier layer, as required in the prior art cited above (U.S. Pat. No. 6,277,702 B1 to Chun et al). This further simplifies the process for making a stacked MIM capacitor. This simplified process is achieved by using a dummy layer 20 that is preferably an insulating material that is very easy to etch, such as silicon oxide. For example, the silicon oxide can be deposited by low-pressure CVD using a reactant gas such as TEOS. Alternatively, a spin-on glass, or a doped spin-on glass, nitride, or silicon oxynitride can be used for the dummy layer 20. The height H (or thickness) of the dummy layer 20 is selected to provide the desired capacitor area for fine-tuning the capacitance value for the circuit requirements. More specifically, the dummy layer 20 is deposited to a thickness of between about 2000 and 12000 Angstroms.

Figure 3:
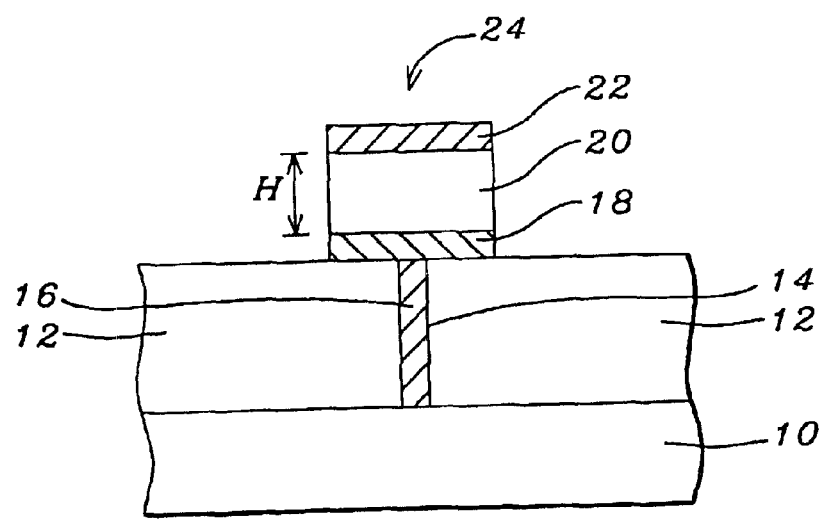

Referring to FIG. 3, conventional photolithographic and anisotropic plasma etching are used to pattern the second metal layer 22, the dummy layer 20, and the first metal layer 18 to leave portions 24 of the stacked layer over the node contacts 16. The stacked layer (22, 20, 18) can be etched using reactive ion etching (RIE). The relatively thin metal layers 22 and 18 can be easily etched using plasma etching in a system such as a reactive ion etcher, an electron cyclotron reactive (ECR) etcher or the like. The thick dummy layer 20 can be easily etched with high resolution using current technologies, such as plasma etching in an etchant gas containing a fluorine species. These patterned portions 24 form part of the capacitor lower electrodes while the height (thickness) of the dummy layer 20 is used to control the value and accuracy of the capacitance.

Figure 4:
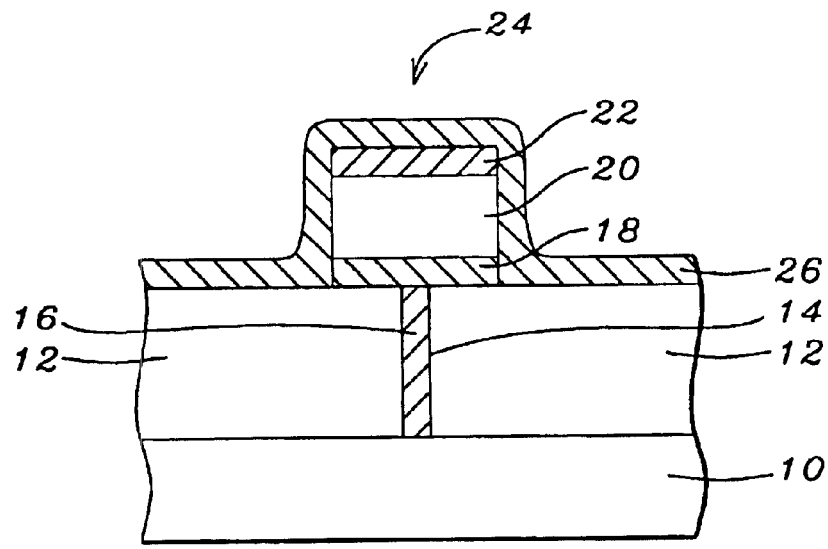

Referring to FIG. 4, a blanket conformal third metal layer 26 is deposited on the substrate 10 and over the portions 24 of the stacked layer. The third metal layer 26 is preferably a transition metal layer, for example one selected from the group that includes platinum, ruthenium, and iridium. Alternatively, other conducting materials can be used when a stable high-k dielectric film is deposited. Third metal layer 26 can be deposited, for example, by physical vapor deposition, CVD, or ALCVD. Layer 26 is deposited to a preferred thickness of between about 100 and 1000 Angstroms.

Figure 5:
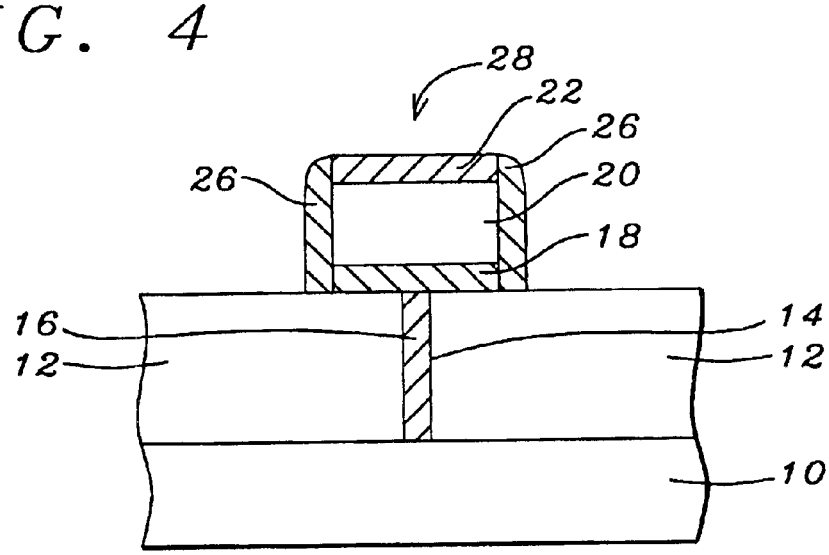

Next, as shown in FIG. 5, the third metal layer 26 is anisotropically etched back to form sidewall spacers 26 on the portions 24 of the stacked layer. The third metal layer is etched back using anisotropic plasma etching in a system such as a reactive ion etcher, an ECR etcher or the like. Since the dummy layer 20 is in insulating material (not polysilicon), an additional barrier layer is not required, simplifying the process steps still further. The remaining portions of layers 18, 22, and 26 on the patterned dummy layer 20 form the lower electrodes 28 for the stacked KM capacitors.

Figure 6:
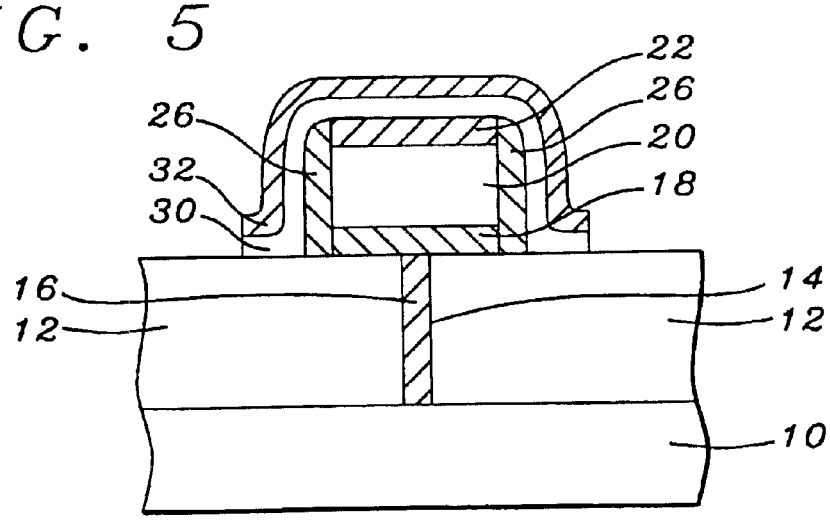

Referring next to FIG. 6, a blanket conformal inter-electrode dielectric layer (IDL) 30 is deposited on the substrate and over the lower electrodes 28. To further increase the capacitance, the preferred IDL layer 30 is a high-dielectric-constant material, such as one selected from the group that includes $SrTiO_3$, $(Ba.Sr)TiO_3$, and PZT, and the like. Layer 30 can be deposited, for example by physical vapor deposition, sputter deposition, CVD, or ALCVD. The thickness of IDL 30 is dependent upon the high-k material used, but is preferably between about 10 and 500 Angstroms.

Still referring to FIG. 6, a blanket conformal fourth metal layer 32 (a plate metal) is deposited on the IDL 30 for forming the capacitor upper electrode. The fourth metal layer is a transition metal selected from the group that includes platinum, ruthenium, and iridium, deposited, for example, by physical vapor deposition or CVD. Layer 32 is formed to a preferred thickness of between about 100 and 1200 Angstroms. Layers 32 and 30 are patterned to leave portions over the capacitor lower electrodes 28 to form the capacitor upper electrodes 32 and to complete the stacked MIM capacitors.

While the invention has been particularly shown and described with reference to the preferred embodiment thereof, it will be understood by those skilled in the art that various changes in form and details away be made without departing from the spirit and scope of the invention. Although this novel stacked capacitor utilizes a dummy layer formed from an insulating material, it should be understood that any material that does not react with the transition metal layers, and therefore does not require barrier layers, can also be used as the dummy layer.

What is claimed is:

1. A method for making stacked metal-insulator-metal (MIM) capacitors on a semiconductor substrate comprising the steps of:
   providing said semiconductor substrates having partially completed circuits;
   depositing an insulating layer and forming openings for node contacts;
   forming said node contacts in said openings;
   depositing sequentially a first metal layer, a dummy layer, and a second metal layer on said insulating layer and over said node contacts;
   patterning said second metal layer, said dummy layer, and said first metal layer and leaving portions over said node contacts;
   depositing a blanket third metal layer on said substrate and over said portions, and etching back to form sidewall spacers on said portions to provide lower electrodes for said capacitors;
   depositing a blanket conformal interelectrode dielectric layer (IDL) on said substrate and over said lower electrodes;
   depositing a blanket fourth metal layer on said IDL and patterning said fourth metal layer and said IDL to form upper electrodes to complete said MIM capacitors.

2. The method of claim 1, wherein said insulating layer is silicon oxide deposited by chemical vapor deposition to a thickness of between about 3000 and 12000 Angstroms.

3. The method of claim 1, wherein said node contacts are formed by depositing a polysilicon layer sufficiently thick to fill said openings and polishing back to said insulating layer.

4. The method of claim 1, wherein said first metal layer is selected from the group that include titanium nitride, tungsten nitride, tantalum nitride, titanium, and tungsten.

5. The method of claim 1, wherein said first metal layer is a transition metal selected from the group that includes platinum, ruthenium, and iridium, and is deposited to a thickness of between about 100 and 1000 Angstroms.

6. The method of claim 1, wherein said dummy layer is deposited to a thickness of between about 2000 and 12000 Angstroms.

7. The method of claim 6, wherein said dummy layer is an insulating material selected from the group that includes silicon oxide, spin-on glass, doped spin-on glass, nitride, and silicon oxynitride.

8. The method of claim 1, wherein said second metal layer is selected from the group that includes platinum, ruthenium, and iridium, and is deposited to a thickness of between about 100 and 600 Angstroms.

9. The method of claim 1, wherein said blanket third metal layer is selected from the group that includes platinum, ruthenium, and iridium, and is deposited to a thickness of between about 100 and 1000 Angstroms.

10. The method of claim 1, wherein said blanket conformal interelectrode dielectric layer is selected from the group that includes strontium titanate, barium strontium titanate, and PZT and is formed to a thickness of between about 10 and 500 Angstroms.

11. The method of claim 1, wherein said blanket fourth metal layer is selected from the group that includes platinum, ruthenium, and iridium, and is deposited to a thickness of between about 100 and 1200 Angstroms.

12. A method for making a stacked metal-insulator-metal (MIM) capacitors on a semiconductor substrate comprising the steps of:
   providing said semiconductor substrate having partially completed circuits;
   depositing an insulating layer and forming openings for node contacts;
   forming said node contacts in said openings;
   depositing a first metal layer on said insulating layer and over said node contacts;
   depositing a dummy layer on said first metal layer, said dummy layer composed of an insulating material;
   depositing a second metal layer on said dummy layer;
   patterning said second metal layer, said dummy layer, and said first metal layer and leaving portions over said node contacts;
   depositing a blanket third metal layer on said substrate and over said portions, and etching back to form sidewall spacers on said portions to provide lower electrodes for said capacitors;
   depositing a blanket conformal interelectrode dielectric layer (IDL) on said substrate and over said lower electrodes;
   depositing a blanket fourth metal layer on said IDL and patterning said fourth metal layer and said IDL to form upper electrodes to complete said capacitors.

13. The method of claim 12, wherein said insulating layer is silicon oxide deposited by chemical vapor deposition to a thickness of between about 3000 and 12000 Angstroms.

14. The method of claim 12, wherein said node contacts are formed by depositing a polysilicon layer sufficiently thick to fill said openings and polishing back to said insulating layer.

15. The method of claim 12, wherein said first metal layer is a transition metal selected from the group that includes platinum, ruthenium, and iridium, and is deposited to a thickness of between about 100 and 1000 Angstroms.

16. The method of claim 12, wherein said dummy layer composed of said insulating material is deposited to a thickness of between about 2000 and 12000 Angstroms.

17. The method of claim 16, wherein said insulating material is selected from the group that includes silicon oxide, spin-on glass, doped spin-on glass, nitride, and silicon oxynitride.

18. The method of claim 12, wherein said second metal layer is selected from the group that includes platinum, ruthenium, and iridium, and is deposited to a thickness of between about 100 and 600 Angstroms.

19. The method of claim 12, wherein said blanket third metal layer is selected from the group that includes platinum, ruthenium, and iridium, and is deposited to a thickness of between about 100 and 1000 Angstroms.

20. The method of claim 12, wherein said blanket conformal interelectrode dielectric layer is selected from the group that includes strontium titanate, barium strontium titanate, and PZT, and is formed to a thickness of between about 10 and 500 Angstroms.

21. The method claim 12, wherein said blanket fourth metal layer is selected from the group that includes platinum, ruthenium, and iridium, and is deposited to a thickness of between 100 and 1200 Angstrom.

22. A stacked metal-insulator-metal (MIM) capacitor on a semiconductor substrate comprised of:
   said semiconductor substrate having partially completed circuits;
   an insulating layer having openings with node contacts in said openings;
   portions of a patterned stacked layer formed from a lower first metal layer, a dummy layer comprised of an insulating material, and an upper second metal layer, said portions over and contacting said node contacts;
   sidewall spacers formed from a third metal layer on said portions of said stacked layer for capacitor lower electrodes;
   an interelectrode dielectric layer (ML) on said lower electrodes;
   upper electrodes comprised of a patterned fourth metal layer over said lower electrodes.

23. The structure of claim 22, wherein said insulating layer is silicon oxide having a thickness of between about 3000 and 12000 Angstroms.

24. The structure of claim 22, wherein said node contacts are a material selected from the group that includes polysilicon, tungsten, and a combination thereof.

25. The structure of claim 22, wherein said lower first metal layer is selected from the group that includes titanium nitride, tungsten nitride, tantalum nitride, titanium, and tungsten, and said upper second metal layer is selected from the group that includes platinum, ruthenium, and iridium, and having a thickness of between about 100 and 1000 Angstroms.

26. The structure of claim 22, wherein said dummy layer comprised of said insulating material is selected from the group that includes silicon oxide, spin-on glass, doped spin-on glass, nitride, and silicon oxynitride, and has a thickness of between about 2000 and 12000 Angstroms.

27. The structure of claim 22, wherein said third metal layer is selected from the group that includes platinum, ruthenium, and iridium, and said sidewall spacers have a thickness of between about 100 and 1000 Angstrom.

28. The structure of claim 22, wherein said interelectrode dielectric layer is selected from the group that includes strontium titanate, barium strontium titanate, and PZT, and has a thickness of between about 10 and 500 Angstroms.

29. The structure of claim 22, wherein said fourth metal layer is selected from the group that includes platinum, ruthenium, and iridium, and has a thickness of between about 100 and 1200 Angstroms.

30. A method for making a stacked metal-insulator-metal (MEW) capacitor on a semiconductor substrate comprising:
   forming a stacked first electrode comprising a first metal layer, a dummy layer, and a second metal layer;
   forming a third metal layer over the stacked electrode to form metal sidewall spacers;
   forming a conformal interelectrode dielectric layer (IDL) adjacent the stacked electrode;
   forming a second electrode adjacent to the IDL opposite to the stacked first electrode to complete the MIM capacitor.

31. The method of claim 30 wherein the IDL has a relatively high dielectric constant.

* * * * *